US011836420B1

(12) United States Patent
Levanti et al.

(10) Patent No.: US 11,836,420 B1
(45) Date of Patent: Dec. 5, 2023

(54) CONSTRUCTING A 3D MODEL OF A FACILITY BASED ON VIDEO STREAMS FROM CAMERAS AT THE FACILITY

(71) Applicant: Amazon Technologies, Inc., Seattle, WA (US)

(72) Inventors: Kyriaki Levanti, Seattle, WA (US); Derek Solomon Pai, Seattle, WA (US); Isaac Ben Jeppsen, Shoreline, WA (US)

(73) Assignee: Amazon Technologies, Inc., Seattle, WA (US)

( * ) Notice: Subject to any disclaimer, the term of this patent is extended or adjusted under 35 U.S.C. 154(b) by 257 days.

(21) Appl. No.: 16/916,000

(22) Filed: Jun. 29, 2020

(51) Int. Cl.
*G06F 30/13* (2020.01)
*G06T 17/10* (2006.01)
*G06T 7/73* (2017.01)

(52) U.S. Cl.
CPC .............. *G06F 30/13* (2020.01); *G06T 7/74* (2017.01); *G06T 17/10* (2013.01); *G06T 2207/10016* (2013.01); *G06T 2210/04* (2013.01); *G06T 2215/16* (2013.01)

(58) Field of Classification Search
None
See application file for complete search history.

(56) References Cited

U.S. PATENT DOCUMENTS

| | | | |
|---|---|---|---|
| 6,912,293 B1 | 6/2005 | Korobkin | |
| 7,995,096 B1 * | 8/2011 | Cressy | G08B 13/19691 348/143 |
| 2008/0158345 A1 * | 7/2008 | Schklair | G06T 17/20 348/47 |
| 2010/0321492 A1 * | 12/2010 | Cornett | G08B 13/19641 348/143 |
| 2011/0115816 A1 * | 5/2011 | Brackney | H05B 47/19 700/295 |
| 2011/0285851 A1 * | 11/2011 | Plocher | G08B 13/19645 340/541 |
| 2013/0009950 A1 * | 1/2013 | Ben-David | G06T 17/05 345/419 |
| 2013/0246576 A1 * | 9/2013 | Wogsberg | H04N 21/654 709/219 |
| 2014/0016913 A1 * | 1/2014 | Hamada | G06F 21/6254 386/278 |
| 2015/0062334 A1 * | 3/2015 | Dickinson | H04N 5/23299 348/143 |

(Continued)

*Primary Examiner* — Kent W Chang
*Assistant Examiner* — Jonathan M Cofino
(74) *Attorney, Agent, or Firm* — Robert C. Kowert; Kowert, Hood, Munyon, Rankin & Goetzel, P.C.

(57) ABSTRACT

A 3D modeling service of a provider network may receive, from a client facility, different video streams from different cameras at the facility (e.g., security cameras). The 3D modeling service may generate a collection of image data based on the different video streams. The 3D modeling service may construct a 3D model of the facility based at least on the collection of image data and other data from one or more other sources (e.g., CAD files other floor plans). The 3D model may be analyzed to determine various aspects, such as a location to place equipment or coverage gaps of the security cameras. Facility management may perform various actions based on updated 3D models. For example, equipment may be installed at a location or cameras may be installed to eliminate coverage gaps.

20 Claims, 9 Drawing Sheets

(56) References Cited

U.S. PATENT DOCUMENTS

| | | | |
|---|---|---|---|
| 2015/0310135 A1* | 10/2015 | Forsyth | G06F 30/13 |
| | | | 703/1 |
| 2015/0312426 A1 | 10/2015 | Schoner et al. | |
| 2016/0044282 A1* | 2/2016 | Veluchamy | H04N 5/23206 |
| | | | 348/14.04 |
| 2016/0360428 A1* | 12/2016 | Priest | H01Q 1/00 |
| 2017/0094326 A1* | 3/2017 | Arimilli | H04N 21/2393 |
| 2017/0244959 A1* | 8/2017 | Ranjeet | H04N 13/349 |
| 2018/0084242 A1* | 3/2018 | Rublee | G06T 19/003 |
| 2018/0285653 A1* | 10/2018 | Li | G08B 13/19645 |
| 2019/0098233 A1* | 3/2019 | Gassend | H04N 5/23238 |
| 2019/0385373 A1* | 12/2019 | Mittleman | G08B 29/18 |
| 2021/0037174 A1* | 2/2021 | Meganathan | G08B 13/19641 |
| | | | 348/143 |
| 2021/0149353 A1* | 5/2021 | Suindykov | G05B 17/02 |
| 2023/0100244 A1* | 3/2023 | Ouellette | G08B 13/19641 |
| | | | 348/143 |

* cited by examiner

CONSTRUCTING A 3D MODEL OF A FACILITY BASED ON VIDEO STREAMS FROM CAMERAS AT THE FACILITY

BACKGROUND

After a new facility is constructed, computer-aided design (CAD) files or other documents are often made available for facility management in order to perform various aspects of facility planning. For example, management may refer to a CAD file for a product manufacturing plant in order to decide where to place different equipment, rooms to store inventory in, locations to place security cameras and fire extinguishers, and areas to set up office space.

Although the initial CAD files of a facility may be helpful for facility management in making decisions on how to make use of the facility, the CAD files may become less accurate and less useful over time. For example, over a few years (or even a few weeks), various walls may be added or removed and different equipment may be added removed. As initial design documents (CAD files, floor plans, etc.) become more out of date, it may become more difficult and time consuming for facility managers to plan changes to a facility or to ensure that a facility is meeting various safety standards.

Figure 1:
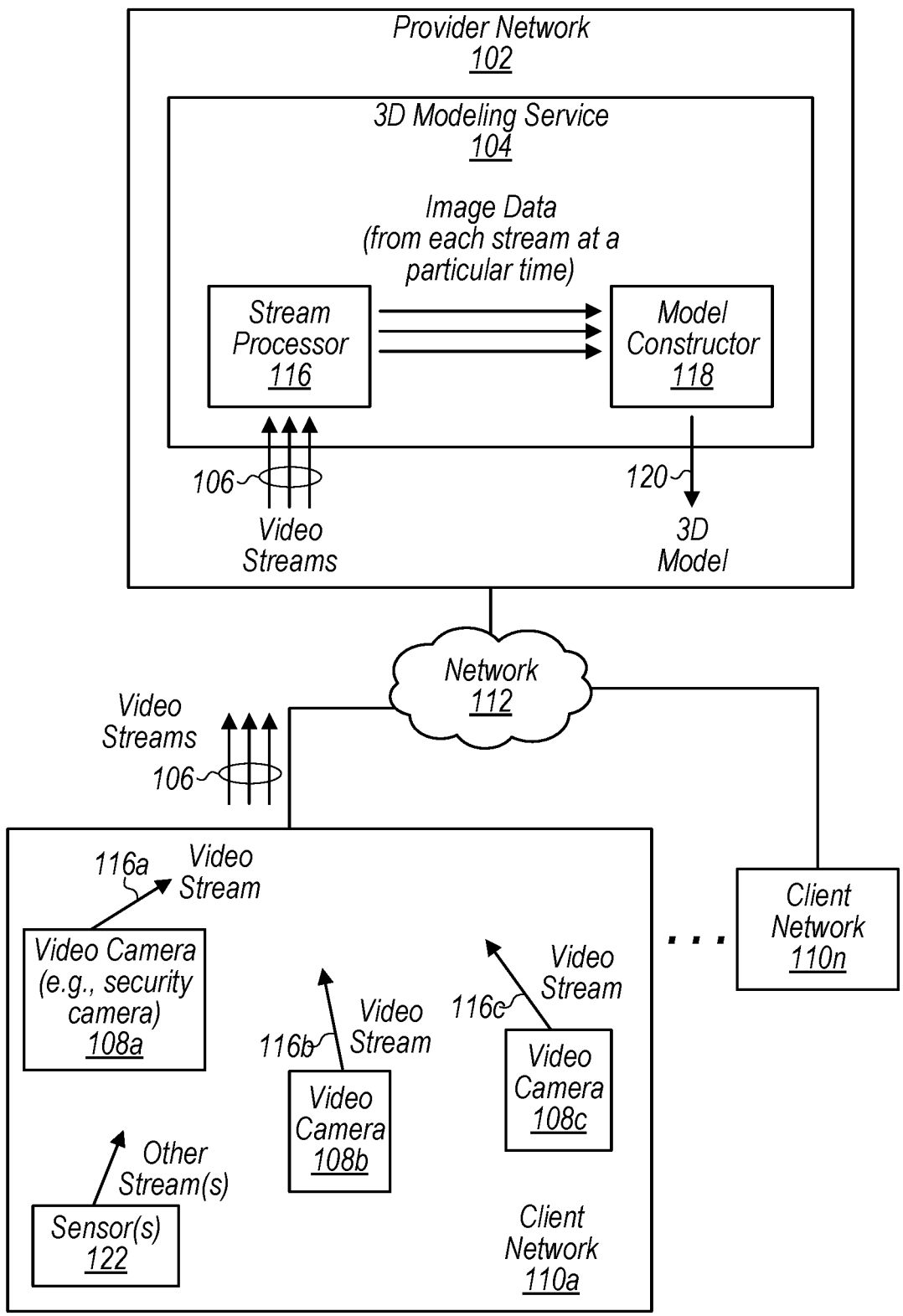
FIG. 1 is a logical block diagram illustrating a system for constructing a 3D model of a facility based on video streams from cameras at the facility, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

The systems and methods described herein may be employed in various combinations and in various embodiments to construct a 3D model of a facility based on video streams from cameras at the facility, according to some embodiments. In embodiments, constructing a 3D model of a facility based on video streams from cameras (e.g., security cameras and/or other types of cameras) at a facility may reduce the amount of time needed to generate accurate and up-to-date models of a facility, compared to other techniques. Furthermore, embodiments described reduce the time used to identify changes that need to be made to a facility. By using streams from security cameras, fewer computing resources and other data collecting resources may be needed in order to construct accurate and up-to-date models of a facility.

In some embodiments, photogrammetry (e.g., stereophotogrammetry) and/or other image-based techniques may be used to construct a 3D model of a facility, based on any number of video streams. In embodiments, a set of input images (input image data) of an environment from multiple viewpoints (e.g., from different video cameras) taken at the same time (e.g., approximately the same time or within a period of time) may be used to construct a 3D model. In embodiments, the images may be taken at the same time to mitigate the effect of changing lighting conditions and/or other changes in the environment that may occur over time.

In embodiments, any suitable photogrammetry/stereophotogrammetry or related techniques may be used by a 3D modeling service to determine (e.g., extract) three-dimensional measurements from an image that is collected by a video camera and transmitted in a video stream. For example, if the scale of the image captured by a camera is known, then distance between two points that lie on a plane parallel to the photographic image plane can be determined by measuring the distance between the two points on the image. In embodiments, the 3D modeling service may construct and/or render at least a portion of the 3D model or the 3D model based at least on determining/extracting, from the image data, of color ranges and/or values representing quantities as albedo, specular reflection, metallicity, and/or ambient occlusion. In embodiments, one or more image processing models may be used to construct the 3D model based on input image data from any number of cameras (e.g., using photogrammetry and/or other image-based techniques).

In embodiments, by using camera streams of a facility, embodiments may produce a live or up-to-date 3D model that is more realistic and/or more dynamic than the initial CAD file for the facility. In some embodiments, a camera live stream aggregation system processes all camera streams and generates a set of images (e.g., "snapshots") at one or more particular times (e.g., at approximately the same time across streams). Embodiments may process the set of images to run a 3D reconstruction that produces an initial (e.g., coarse-grained) 3D model of the facility. The output of this run may serve one or more subsequent runs by providing the location of the cameras and/or by highlighting coverage gaps of the cameras. In embodiments, the camera locations may be used to improve the performance of subsequent reconstructions and/or the coverage gaps may be mitigated with the addition of security cameras. As a result, facility management may constantly have available an up-to-date plan of the facility that can be used to monitor the well-being of the facility (e.g., wall damage, existence of fire extinguishers at certain locations) and to plan facility changes (e.g., addition or removal of walls, addition or removal of equipment).

In embodiments, an image processing model may identify (e.g., detect using object recognition) an object/subject, a coverage gap, or other items/features of a 3D model. In embodiments, object recognition may refer to a collection of one or more computer vision tasks (e.g. classification, detection, segmentation, localization, etc.) implemented by one or more image processing models (e.g., using the 3D model or a portion of the 3D model as input) to identify an object/subject, a coverage gap, and/or other items of relevance in the image data. For example, an image processing model may identify an object or a coverage gap by implementing one or more tasks to analyze/process data of the 3D model. In embodiments, any suitable type of image processing models may be implemented (e.g., neural networks such as convolutional neural networks (CNNs).

In various embodiments, the components illustrated in the figures may be implemented directly within computer hardware, as instructions directly or indirectly executable by computer hardware (e.g., a microprocessor or computer system), or using a combination of these techniques. For example, the components of the figures may be implemented by a system that includes one or more computing nodes, in one embodiment, each of which may be similar to the computer system embodiment illustrated in FIG. 9 and described below.

This specification begins with a description of a system for constructing a 3D model of a facility based on video streams from cameras at the facility. A number of different methods and techniques to construct a 3D model of a facility based on video streams from cameras at the facility are discussed, some of which are illustrated in accompanying flowcharts. Finally, a description of an example computing system upon which the various components, modules, systems, and/or techniques described herein may be implemented is provided. Various examples are provided throughout the specification.

FIG. 1 is a logical block diagram illustrating a system for constructing a 3D model of a facility based on video streams from cameras at the facility, according to some embodiments.

In the depicted embodiment, a provider network 102 includes a 3D modeling service 104 that implements constructing a 3D model of a facility based on video streams from cameras at the facility. The 3D modeling service 104 may receive any number of video streams 106 from any number of video cameras 108 from any particular remote client network 110 (e.g., at a facility of the client). As discussed in detail below, the 3D modeling service 104 may generate a collection of image data. The collection of image data may include different image data from each video stream 106.

In embodiments, image data from a given video stream may be image data that was collected by a video camera at a particular time. In embodiments, image data may be data that represents an image. Therefore, image data collected by a video camera at a particular time may be data that represents an image collected and/or detected by the video camera at a particular time. As described in further detail herein, the 3D modeling service 104 may construct a 3D model of the facility based at least on the collection of image data. In embodiments, some or all of the cameras may be at a fixed location of the facility (e.g., mounted onto a wall, ceiling, etc.). In embodiments, one or more of the cameras may be mobile (e.g., on a robot/drone or carried by a person).

As shown, the different client networks 110 are remotely located from the provider network 102 (e.g., in a local (private) network of the client separate from a local network of the provider network). Devices within a given client network 110 may communicate with the provider network (or other networks) via a wide-area network 112 (e.g., the Internet). Different client networks may be controlled and/or owned by different clients of the service 104 and/or provider network. In embodiments, each client network may include any number of different types of devices. For example, client network 110a may include any number of computing devices 114 that may be used to control cameras, configure the 3D modeling service, etc.

In the depicted embodiment, the client network 110a includes video cameras 108a, 108b, and 108c, which respectively provide video streams 116a, 116b, and 116c. A stream processor 116 may of the 3D modeling service 104 may receive the video streams 116a, 116b, and 116c and generate a collection of image data based on the video streams 116a, 116b, and 116c. In embodiments, the collection of image data may include image data from each of the video streams (e.g., data representing an image captured by the camera) that was collected at a particular time or approximate time.

For example, the collection of image data may include image data collected by camera 116a at a particular time (e.g., a 10:00am according to a local clock of the camera or a master/global clock referenced by all cameras), image data collected by camera 116b at a particular time (e.g., 10:00am according to a local clock of the camera or the global clock), and image data collected by camera 116c at a particular time (e.g., 10:00am according to a local clock of the camera or the global clock). In embodiments, each stream may include any number of timestamps that indicate when image data from a particular portion of the stream was collected at the particular time or the approximate time (e.g., based on the local clock of the camera or the global clock 117). Therefore, the 3D modeling service may identify and obtain the image data from each stream based on the timestamp for the image data. In some embodiments, the global clock referenced by each of the cameras may be located at the client network or at the provider network (e.g., provided by the 3D modeling service/streaming processor or other service). In some embodiments, the current time of the global clock may be used to add timestamps to the incoming video streams at the stream processor (e.g., at any interval of time, such as every second, minute, etc.).

In the depicted embodiment, a model constructor 118 of the 3D modeling service 104 may construct a 3D model 120 of the facility based at least on the collection of image data. In embodiments, the 3D modeling service 104 may implement photogrammetry and/or other image-based techniques (e.g., using the collection of image data) to construct a 3D model 120 of a facility of the client. The 3D modeling service 104 may then send the 3D model 120 to the client network and/or to another destination (e.g., for analysis). In some embodiments, the 3D modeling service 104 itself may analyze the 3D model 120 to generate a result and send the result to the client network and/or to another destination. For example, the 3D modeling service 104 may identify one or more coverage gaps of the cameras at the facility or identify one or more particular types of objects at the facility (e.g., walls, fire extinguishers, additional video cameras, a particular type of production equipment).

In embodiments, the model constructor may obtain other data descriptive of the facility (data that originates from one or more sources other than the cameras), and the model constructor may construct the 3D model of the facility based at least on the collection of image data and the other data. In various embodiments, the other data descriptive of the facility may include any type of data that indicates one or more physical constraints (e.g., measurements) of the facility. For example, the physical constraints may be physical dimensions of a building and/or physical dimensions of a worksite (some or all of the worksite may be located outside). In embodiments, the model constructor may fill in one or more coverage gaps or portions of coverage gaps using the other data (e.g., measurements from a CAD file, measurements entered by a user, or any other data/files described herein).

In embodiments, the physical constraints may include the position of a camera (e.g., 3D coordinates) in a facility, the distance between any two cameras, the floor a camera is located on, and/or the distance between any objects/structures and any other object/structure (e.g., distance between a camera and another camera, distance between a camera and a point on a wall, distance between two walls, etc.).

In some embodiments, any number of sensors 122 may provide an additional stream of data to the 3D modeling service, which may be used by the 3D modeling service to construct the 3D model or to augment/enhance the 3D model. Any type of sensor may be used to provide an additional data stream. For example, infrared sensor, light detection and ranging (LIDAR), and terahertz sensors may provide one or more streams of data concurrently with the video streams 106. In embodiments, the additional data streams from the sensors may also be timestamped based on a local or global clock. Therefore, the stream processor may select data from the data stream that was collected at a particular point in time (e.g., the same or approximately same point in time as a collection of image data was collected by the cameras).

In embodiments, the model constructor may construct the model based on additional input of distance measurements that are provided by a LIDAR sensor(s) or may annotate the 3D model to indicate different amounts of heat detected at different locations by the infrared sensor. As another example, the model constructor may construct the model based on additional input provided by a terahertz sensor/imager (objects detected within walls or on the other side of walls/objects (e.g., studs, wires) that are not detectable by visible light). The model constructor may annotate the 3D model to indicate such objects (e.g., adding text and/or graphical indicators to the 3D model).

Figure 2:
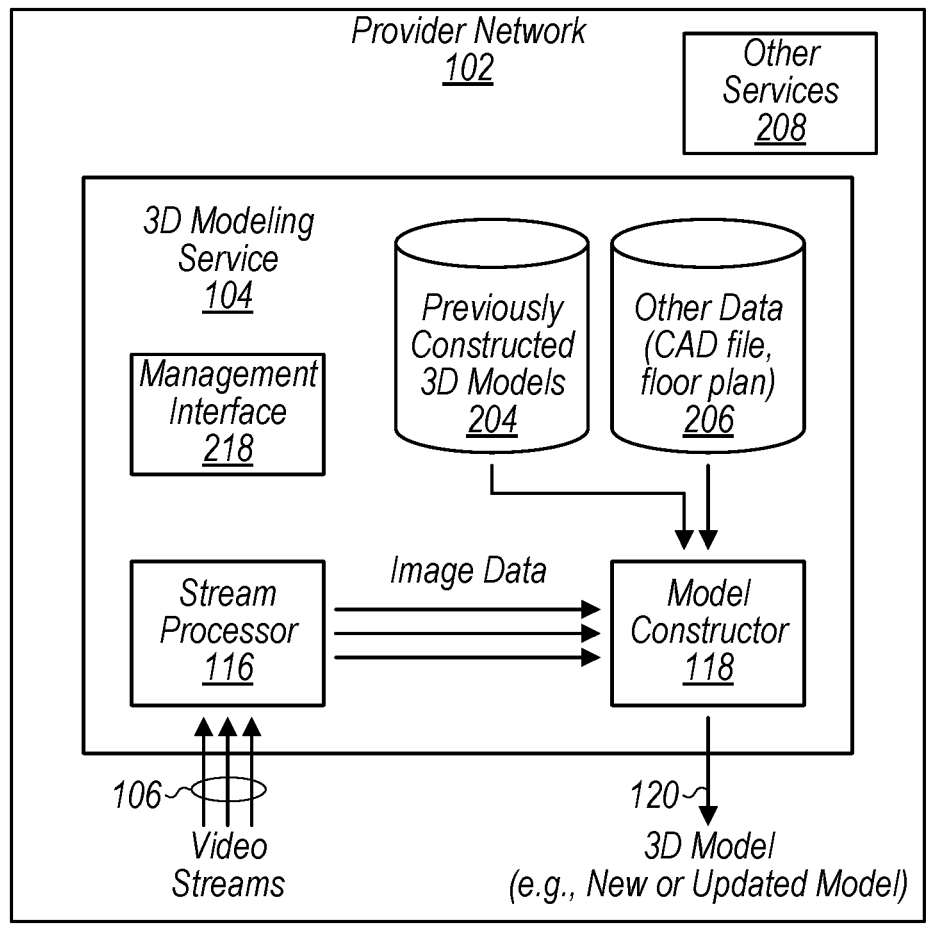
FIG. 2 is a logical block diagram illustrating a facility and a system for constructing a 3D model of the facility based on video streams from cameras at the facility, according to some embodiments.
Figure 2:
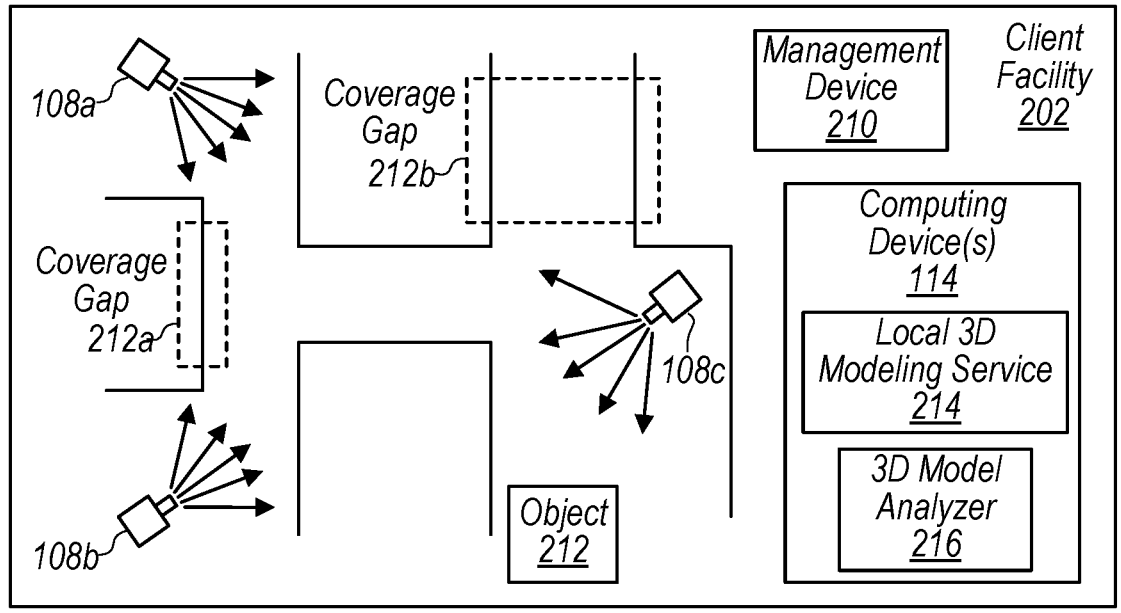

FIG. 2 is a logical block diagram illustrating a facility and a system for constructing a 3D model of the facility based on video streams from cameras at the facility, according to some embodiments.

As shown, the provider network 102 includes a 3D modeling service 104 that implements constructing a 3D model of a facility 202 of a client based on video streams from cameras at the facility 202. In the example embodiment, the 3D modeling service 104 also includes a data store that includes previously constructed 3D models 204 constructed for the facility 202 and another data store that includes other data 206 that maybe used in the construction of a 3D model for a facility 202. For example, the other data 206 may be one or more CAD files for the facility 202, floor plans for the facility 202, etc. In embodiments, the 3D models 204 and the other data 206 may include previously constructed 3D models and/or other data for any number of other facilities of the same client and/or other clients. In embodiments, the provider network 102 may include any number of other services 208 that may be used by the 3D modeling service 104 and/or clients of the 3D modeling service 104 and/or the provider network.

In addition to the collection of image data, in some embodiments the model constructor 118 may take into account a previously constructed 3D model of the facility and/or any amount of other data descriptive of the facility (e.g., from any number of sources other than the video cameras 108) to construct the 3D model. In various embodiments, the 3D modeling service/model constructor may receive the other data from a management device 210 at the client facility/network (e.g., via user input) or from the data store of other data 206. Similarly, the 3D modeling service/model constructor may receive the previously constructed 3D model from a management device at the client facility/network (e.g., via user input) or from the data store of previously constructed 3D models 204.

In some embodiments, the model constructor 118 uses the previously constructed 3D model and/or other data to supplement and/or fill in areas of the 3D model that correspond to areas of the facility that are not detected by any of the cameras that provided the video streams (e.g., coverage gaps 212a, 212b of the cameras). Areas of the 3D model that correspond to coverage gaps do not necessarily reflect the current structure of the facility because the previously constructed 3D model and/or other data may not be up-to-date.

In embodiments, the 3D model may include a representation of an object 212 (also referred to as the "object") at the facility. The model constructor may include the object 212 during the construction of the 3D model, based on image data collected by the video camera 108c. In some embodiments, a model analyzer may analyze the 3D model to determine whether the object 212 is temporary or permanent. For example, the 3D modeling service may compare the recent or updated 3D model with one or more previously generated 3D models of the facility. If the object was at one or more different locations of the facility in any number of previously generated 3D models, then the 3D modeling service may determine that the object is temporary.

In embodiments, if the object was at the same location of the facility in any number of previously generated 3D models or for any amount of time (e.g., at least a threshold number of previous models or for a threshold period of time), then the 3D modeling service may determine that the object is permanent. If the model analyzer determines based on analysis that the object is temporary, then the model analyzer may remove the object from the updated 3D model (e.g., before sending the model to a destination for display or storage). In embodiments, 3D models, updated 3D models, and any generated results (e.g., generated by a model analyzer) may be transmitted and displayed on any computing device 114 at the client facility (e.g., in a browser or other viewing application) or a mobile device of the client.

In embodiments, an image processing model of a 3D model analyzer (e.g., of an analyzer at the provider network or the client facility) may identify the object as a particular type of object and based on the type of object, determine whether the object is temporary or permanent. For example, if the analyzer identifies that the object is a particular type of equipment (e.g., a ladder), then the analyzer may determine that the object is temporary, but if the analyzer identifies that the object is another type of equipment (e.g., new production equipment), then the analyzer may determine that the object is permanent (e.g., relative to more temporary objects like ladders).

In some embodiments, the client network at the client facility may include one or more computing devices that may host a local 3D modeling service 214 and/or a 3D model analyzer 216. In embodiments, the local 3D modeling service 214 may include some or all of the components and perform some or all of the functionality of the 3D modeling service 104 of the provider network. In such cases, the client may produce 3D models at a faster rate and analyze those models at a faster rate, at least in part because the video streams and/or the constructed 3D model does not need to be transmitted via the network 112.

In embodiments, a client may require high end and expensive computing devices in order to implement a local 3D modeling service 214 and/or a local 3D model analyzer 216. Therefore, in some embodiments only some of the functionality of the 3D modeling service 104 may be implemented by the local 3D modeling service 214 due to limited computing capability of the computing devices 214 of the client network. In this case, some of the functionality described above for the 3D modeling service 104 may be implemented locally and some may be implemented at the provider network. For example, the 3D model may be generated at the provider network while analysis of the 3D model may occur at the client network (or vice-versa). In various embodiments, any portion of the described components or functionality of the 3D modeling service 104 may be implemented at the client network and/or the provider network.

As shown, the 3D modeling service 104 includes a management interface 218 (e.g., one or more application programming interfaces (APIs)) that a user of a client network may access via the management device 210 (e.g., via a command line interface, graphical user interface, or other type of input). A user may perform any configuration of the 3D modeling service 104 as described herein by providing configuration commands via the management device 210 and/or the management interface 218.

In some embodiments, the 3D model of the client facility may be associated/tagged with descriptive data such as coordinates, orientation, and/or other physical characteristics of the client facility so that another software application/ system may incorporate the 3D model (or at least certain portions/data of the 3D model) into the application. For example, the 3D model may be registered with a global viewer application (e.g., within a 3D coordinate system) that allows a user to view a map of at least a portion of the surface of the Earth that shows the location of the client facility on the map. In embodiments, the user may zoom (e.g., magnify) the map so that more details of the client facility are displayed (e.g., exterior portions of the client facility) as the user continues to zoom in. The viewer application may allow the user to zoom in towards a north wall of the facility and into the facility so that the user can see what the interior of the facility looks like on the other side of the north wall (e.g., based on the coordinates, orientation, and the 3D model itself). In embodiments, any portion of the exterior or interior of the client facility may be viewed in such a manner.

Figure 3:
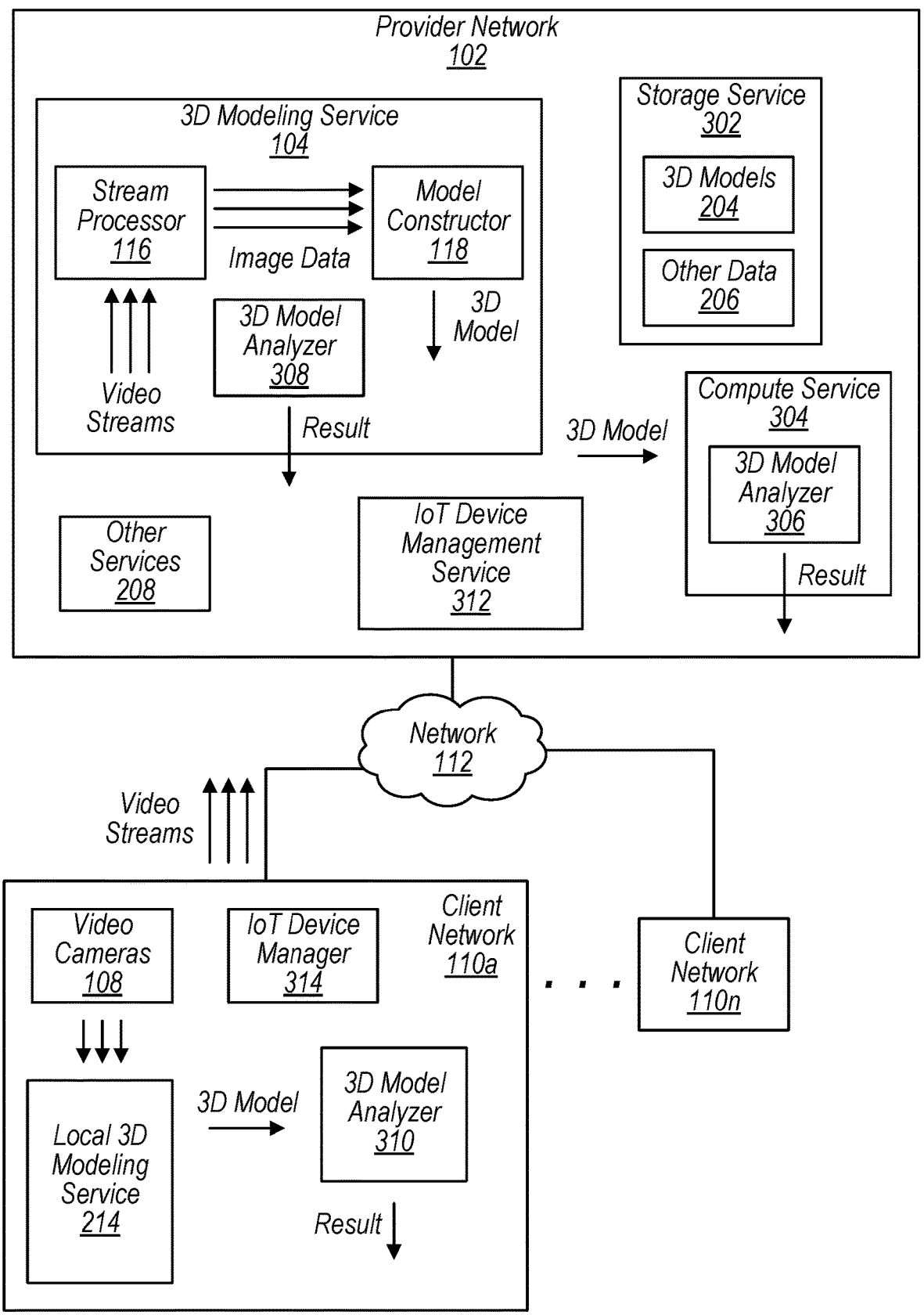
FIG. 3 is a logical block diagram illustrating a system for constructing a 3D model of a facility based on video streams from cameras at the facility, according to some embodiments.

FIG. 3 is a logical block diagram illustrating a system for constructing a 3D model of a facility based on video streams from cameras at the facility, according to some embodiments.

In the depicted embodiment, the provider network 102 includes a 3D modeling service 104 that implements constructing a 3D model of a facility 202 of a client based on video streams from cameras at the facility 202. In the example embodiment, a storage service 302 of the provider network includes a data store that includes previously constructed 3D models 204 constructed for the facility 202 and another data store that includes other data 206 that maybe used in the construction of a 3D model for a facility 202. For example, the other data 206 may be one or more CAD files for the facility 202, floor plans for the facility 202, 2D models, etc. In various embodiments, the 3D models 204 and the other a store 206 may include previously constructed 3D models and/or other data for any number of other facilities of the same client and/or other clients.

As shown, the provider network 102 may also include a compute service 304 that may perform some or all of the analysis of the 3D model that is constructed by the 3D modeling service 104 (e.g., using a 3D model analyzer 306 hosted by the compute service). The result of the analysis may be provided to one or more destinations, such as a computing/display device at the client network, another compute instance/process hosted by the compute service or client network (e.g., for further analysis), and/or a data store at the provider network or client network.

In embodiments, the 3D modeling service 104 may include its own 3D model analyzer 308 and/or the client network may include a local 3D model analyzer 310 that may perform some or all of the analysis of a constructed 3D model. In embodiments, analysis of the 3D model may occur at one or more of any of the above components. In some embodiments, any type of 2D and/or 3D data may be analyzed by a 3D model analyzer (in addition to the constructed 3D model) in order to generate a result. For example, a 3D model analyzer may obtain a 2D model and reconcile at least some of the data of the 2D model with the 3D model in order to generate a result. Results of the analysis may be provided to a computing/display device at the client network, another compute instance/process hosted by the compute service or client network (e.g., for further analysis), and/or a data store at the provider network or client network.

In some embodiments, a model constructor may construct a 3D model that indicates the location, name/identifier, etc. of the video cameras 108 and/or any other IoT devices at the client facility. For example, a name and/or graphical indicator may be annotated on the 3D model for each video camera so that a user may identify (e.g., using a viewer application) where each of the cameras are located. Based on the annotated 3D model, a user may identify one or more locations at the facility to install new cameras or to move existing cameras to. In embodiments, the locations of the existing cameras may be provided by an administrator when they are configured (e.g., using the device manager 314 and/or the device management service) and/or the locations may be determined based on other data collected by the 3D modeling service (e.g., WiFi positioning data, etc.).

As depicted, the provider network 102 may also include an IoT device management service 312. In embodiments, the IoT device management service 312 may be used by the client (e.g., via a user/administrator accessing the management device 210 and/or a management interface of the IoT device management service 312) to manage the video cameras 108 and/or any other edge devices of the client network. For example, an administrator may register any number of cameras so that they can be configured and controlled by users, services, and/or any other components of the provider network or client network.

Also shown is an IoT device manager 314 which may perform some or all of the functionality of the IoT device management service 312. Therefore, in some embodiments, at least some management of the cameras and/or other devices may be performed locally. The provider network 102 may include any number of other services 208 that may be used by the 3D modeling service 104 and/or clients of the 3D modeling service 104 and/or the provider network.

Figure 4A:
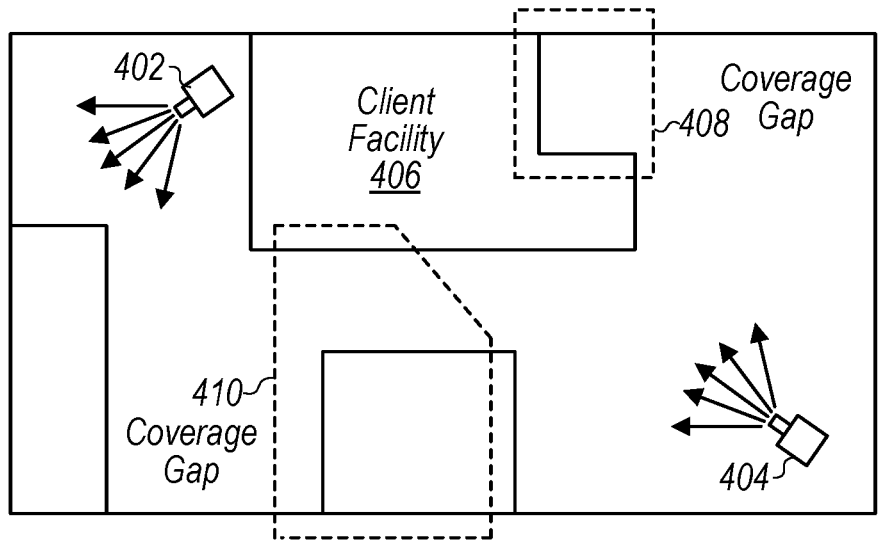
FIG. 4A is an illustration of client facility with identified coverage gaps of cameras at the facility, according to some embodiments.

FIG. 4A is an illustration of client facility with identified coverage gaps of cameras at the facility, according to some embodiments.

In the depicted embodiment, the 3D model provided by the 3D modeling service 104 or the local 3D modeling service 214 may be analyzed (e.g., by one or more 3D image processing models of a 3D model analyzer) to determine a result. For example, the 3D model analyzer 308 (or analyzer 306 or analyzer 310) may identify, based at least on a constructed 3D model (provided by the 3D modeling service 104 or the local 3D modeling service 214), one or more coverage gaps of the cameras 402, 404 at the client facility 406.

The 3D model analyzer may generate data indicating the one or more coverage gaps. For example, the data may be include tags or other metadata that is associated with the identified coverage gap 408 of the client facility and/or the identified coverage gap 410 of the client facility. The tags or other metadata may cause the coverage gaps of the 3D model to be highlighted when the 3D model is displayed on a display device (e.g., at the client network).

In embodiments, the 3D model analyzer 308 (or analyzer 306 or analyzer 310) may determine one or more locations (and/or a corresponding camera orientation) at the facility for installation of additional cameras that would reduce or eliminate individual ones of the identified coverage gaps. In response, the 3D model analyzer may send, to a destination, data indicative of the one or more locations (and/or a corresponding camera orientation) at the facility. For example, the 3D model analyzer may identify one or more locations at the facility to install one or more additional cameras to reduce or eliminate the coverage gap 408 and the 3D model analyzer may identify one or more locations at the facility to install one or more additional cameras to reduce or eliminate the coverage gap 410. In embodiments, 3D model analyzer may identify a particular type of video camera (e.g., out of any number of different types of video cameras available to the client for installation) for each of the identified locations. For example, the different types of cameras may use different versions of hardware, software, and or be provided by different manufacturers.

In various embodiments, the 3D model analyzer may determine a change in orientation one or more of the existing cameras at the facility that will, if implemented, reduce or eliminate individual ones of the identified coverage gaps. In response, the 3D model analyzer may send, to a destination, data indicative of the change in orientation for the one or more cameras.

In embodiments, in response to identifying the one or more coverage gaps, one or more mobile robots with video cameras may travel to the identified locations to capture video of some or all of the coverage gaps (e.g., by issuing a command from the 3D modeling service or other service). An updated 3D model may be constructed based on the additional video streams from the robot(s). This may be useful to provide a better coverage if new cameras are not available or until new cameras can be installed.

Figure 4B:
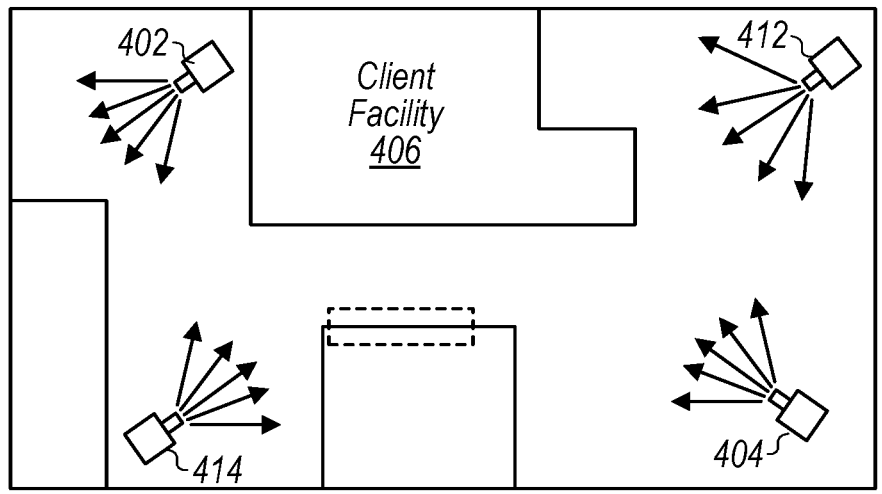
FIG. 4B is an illustration of a client facility with additional cameras that reduce or eliminate coverage gaps identified in FIG. 4A, according to some embodiments.

FIG. 4B is an illustration of a client facility with additional cameras that reduce or eliminate coverage gaps identified in FIG. 4A, according to some embodiments.

In the example embodiment, the 3D model analyzer 308 (or analyzer 306 or analyzer 310) determines a location for an additional camera 412 to be installed in order to reduce or eliminate the coverage gap 408 and the 3D model analyzer 308 (or analyzer 306 or analyzer 310) determines a location for an additional camera 414 to be installed in order to reduce or eliminate the coverage gap 414. As shown, the camera 412 eliminated the coverage gap 408 because the camera 412 may collect image data for the entire area of the coverage gap 408 (e.g., the camera's 412 field of view covers walls, floors, ceilings, etc. of the entire coverage gap). As depicted, the camera 414 reduced the coverage gap 410 because the camera 412 may collect image data for a portion of the area of the coverage gap 408 (e.g., the camera's 412 field of view covers walls, floors, ceilings, etc. of a portion of the entire coverage gap).

The highlighted area (depicted by the dashed line) indicates a smaller coverage gap that exists after installation of the cameras 412, 414. In some embodiments, subsequent analysis may occur at a later time on an updated 3D model (e.g., based on subsequent, additional video streams from the cameras, including newly installed cameras 412, 414). The additional analysis may identify one or more additional locations for cameras to be installed in order to reduce or eliminate the smaller coverage gap. The above process of collecting video streams, identifying coverage gaps, and installing new cameras may be performed any number of times (e.g., according to a schedule) over any amount of time in order for a client to maintain an up-to-date 3D model of any number of facilities.

In embodiments, the additional video streams may include video streams from any number of newly installed cameras. The new cameras may be installed to reduce or eliminated coverage gaps, or they may be installed for any other reason and may allow for the creation of a more up-to-date model. After installation of the new camera(s), the 3D modeling service may receive (e.g., from the remote network of the client), any number of additional video streams from the different cameras (including the new cameras). The 3D modeling service may generate an additional collection of image data based on the additional video streams. As described herein, the additional collection of image data includes respective image data of different video streams collected by a video camera at a subsequent time (e.g., a point in time or a time period that occurs after the image data previously collected that was used for constructing the previous 3D model). In embodiments, an updated 3D model may include any number of any type of new objects (e.g., new fire extinguishers, walls, etc.), different coverage gaps, fewer objects, and/or any other number of changes to the structure and/or items at the facility.

In some embodiments, a client may not wish to have a certain area of the facility included in a 3D model for confidentiality or security reasons. For example, a model for a newly designed car may remain secret for a period of time.

In those cases, a coverage gap may be desired for that area, and the area may be monitored and patrolled by a person or robot. In some cases, the video stream from cameras that cover the secret area may be used for monitoring, but the cameras may be configured so that they do not send video streams to the 3D modeling service. In some embodiments, the 3D modeling service may be configured to remove from the constructed 3D model certain areas, objects, and/or structures that are identified in the constructed 3D model in order to maintain confidentiality of the areas/object/structures. For example, the 3D modeling service may identify, based on the 3D model, one or more objects at a facility as confidential objects and in response, remove the confidential objects from the 3D model. For example, a newly designed car may be removed (e.g., based on object recognition by the 3D analyzer that identifies the car as a confidential object) from the constructed 3D model before the 3D model is provided to a viewing application or other application. As another example, a secret entrance to the facility or a keypad may be removed (e.g., based on object recognition of the keypad or based on configuration input from a user that identifies the door's location as a confidential area).

In embodiments, a 3D model analyzer may infer objects or structures to fill in some or all of a coverage gap in a 3D model. For example, based on objects or structures that in a 3D model that are adjacent to or near a coverage gap, the 3D model analyzer may add a wall or portion of a wall to a coverage gap so that the coverage gap appears to be reduced or eliminated from the 3D model. In embodiments, the portions of the 3D model that are inferred may be graphically highlighted/annotated so that a user may distinguish an inferred portion from other portions of the 3D model.

In various embodiments, the changes made to a facility over time may be viewed (e.g., by a the 3D model analyzer or another viewer application at the client network or provider network) by scrubbing forward or backward along a series of 3D models that were constructed/updated by the model constructor at different points in time as well as future versions of 3D models that would result from potential facility changes. In embodiment, the 3D model analyzer or 3D modeling service may receive, from the client/user, input indicating movement forward (or backward) in time and in response, display subsequent (or previous) versions of the 3D model. In some embodiments, a user may specify a conveyer belt to be placed at a particular location of the facility, and the 3D model analyzer perform what-if analysis to determine how the conveyer belt changes the overall throughput for manufacturing or assembling a product (or how it affects any other aspects of a physical process flow).

In embodiments, a 3D model analyzer may determine, based on the 3D model or updated 3D model, a location to place an object or structure (e.g., equipment such as a conveyer belt) that allows for the highest throughput for manufacturing or assembling a product (or for completing any other process flow). In some embodiments, the model analyzer may determine two or more locations, and rank them from highest to lowest throughput. As with any other results that are determined by the 3D model analyzer or the 3D modeling service, the location(s) may be sent to a destination, such as a display device. The object (e.g., equipment) may be placed/installed at the determined location or the structure may be built at the determined location.

In some embodiments, a robot may use a 3D model as a starting point for navigation of routes throughout the facility (e.g., obstacle avoidance, fastest routes, etc.). After time, the robot may learn obstacles and routes based on its own travel as well. In some embodiments, a 3D model analyzer may perform a light analysis to determine the best locations to place objects or structures (e.g., to reduce or eliminate glare from the sun on an assembly line). In embodiments, the 3D model may be registered with a 3D coordinate system in order for the 3D model analyzer to determine the location of the sun at different times of the day and different days of the year in order to perform the light analysis for different times of the day and different days of the year.

In various embodiments, the client facility may be any number of buildings that each include any number of rooms, floors, etc. In embodiments, at least some or all of a client facility may be outdoors (e.g., some or all of a worksite that is located outside, external from a building). The 3D model analyzer may monitor construction over time. For example, as 3D models are constructed/updated, the 3D model analyzer determine, based on the 3D model, whether a structure that is being built matches design specifications for the structure. For example, the 3D model analyzer may determine, for each updated 3D model, whether one or more measurement dimensions of the structure match (or are close enough of a match) to the measurements of the design specification (e.g., for a building, equipment, or any other physical structure/object).

Figure 5:
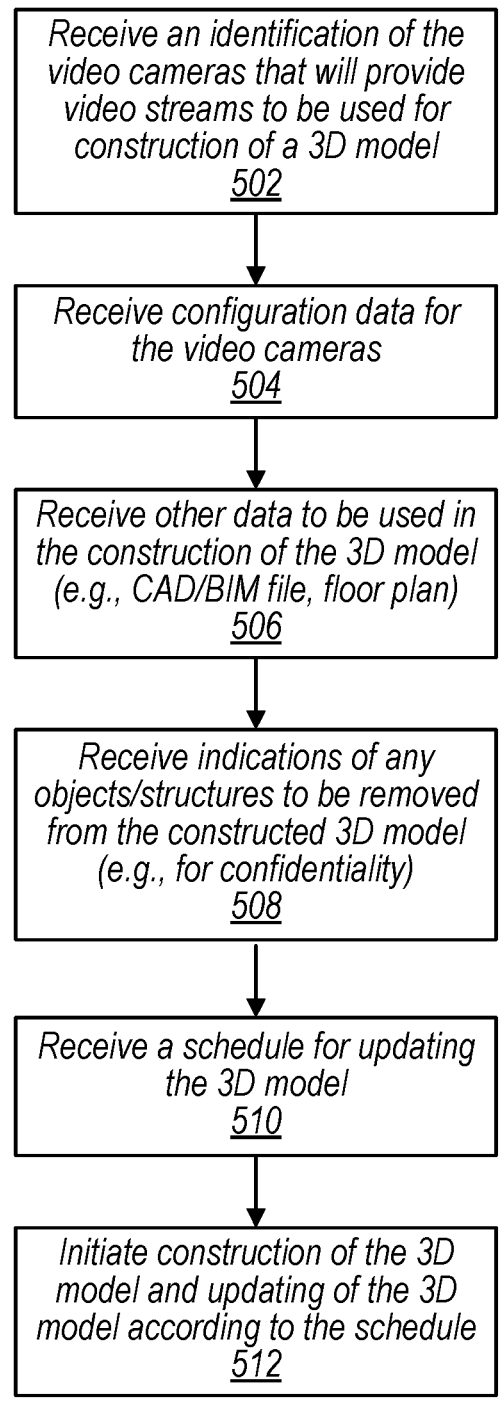
FIG. 5 is a high-level flowchart illustrating various methods and techniques to configure a system for constructing a 3D model of a facility based on video streams from cameras at the facility, according to some embodiments.

FIG. 5 is a high-level flowchart illustrating various methods and techniques to configure a system for constructing a 3D model of a facility based on video streams from cameras at the facility, according to some embodiments. In various embodiments, any of the functionality described for any portions of the flowcharts 5-8 may be performed by any of the components of FIGS. 1-4 and/or 9.

Figure 6:
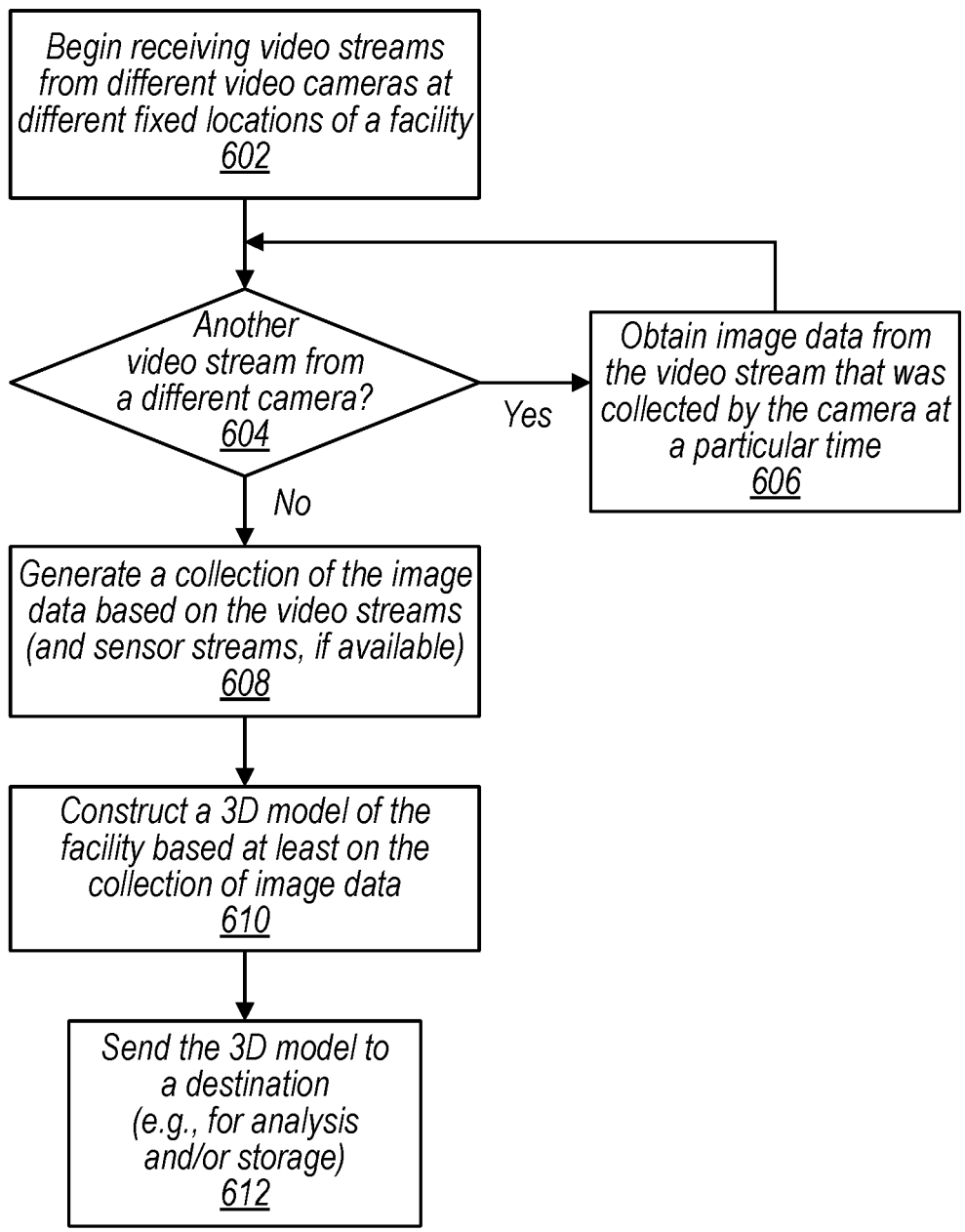
FIG. 6 is a high-level flowchart illustrating various methods and techniques to implement constructing a 3D model of a facility based on video streams from cameras at the facility, according to some embodiments.
Figure 7:
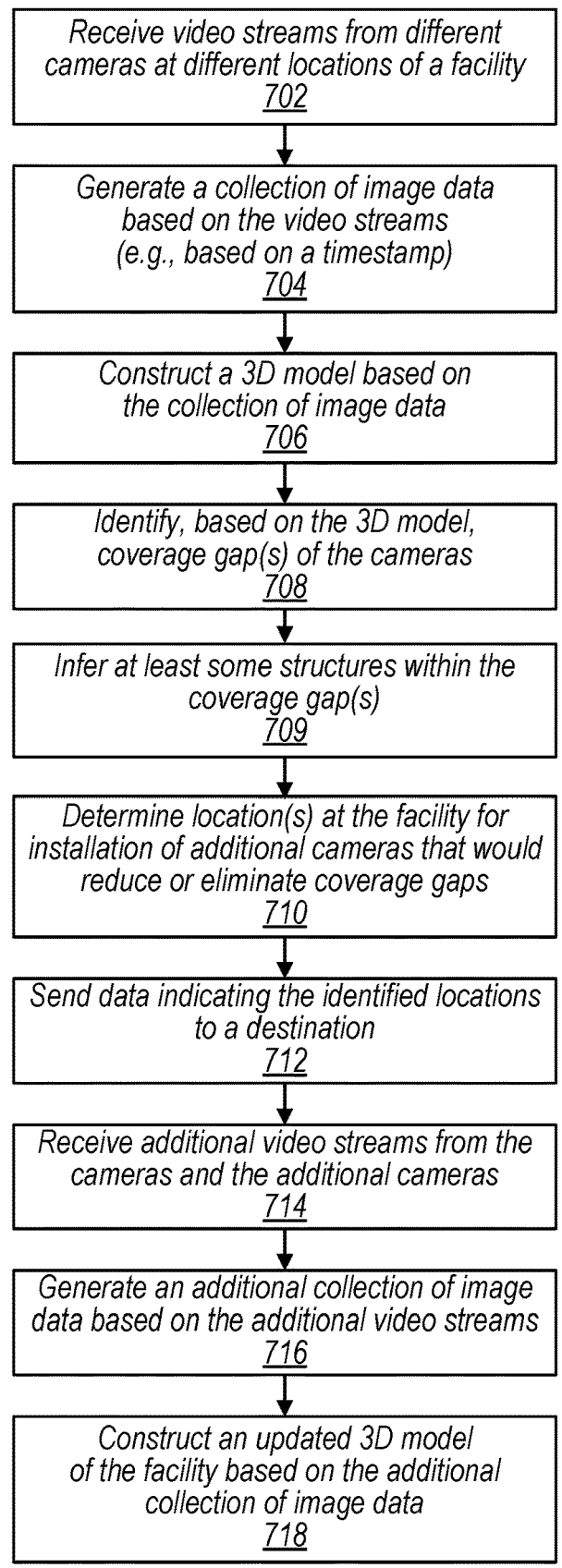
FIG. 7 is a high-level flowchart illustrating various methods and techniques to identify coverage gaps at a facility and to construct an updated 3D model of the facility based on additional cameras at the facility, according to some embodiments.
Figure 8:
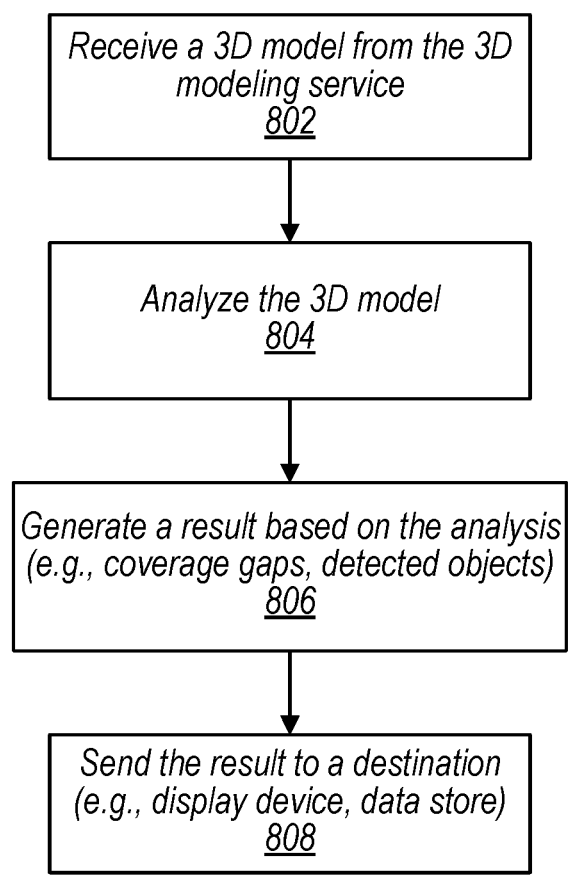
FIG. 8 is a high-level flowchart illustrating various methods and techniques to analyze a 3D model and generate a result based on the analysis, according to some embodiments.

These techniques, as well as the techniques discussed with regard to FIGS. 6-8, may be implemented using components or systems as described above with regard to FIGS. 1-4, as well as other types of components or systems, and thus the following discussion is not intended to be limiting as to the other types of systems that may implement the described techniques. For example, the techniques may be implanted by a 3D modeling service of a provider network and/or a local 3D modeling service of a client network.

At block 502, a 3D modeling service (e.g., 3D modeling service 104 or local 3D modeling service 214) receives an identification of the video cameras that will provide video streams to be used for construction of 3D model(s). For each camera, the identification may include a network address (e.g., IP address) and/or other identifier that uniquely identifies the camera with respect to other cameras. At block 504, the 3D modeling service receives configuration data for the video cameras. In embodiments, the configuration data may include data describing a type of the camera such as type of hardware, type of software, and/or manufacturer of the camera.

At block 506, the 3D modeling service receives other data to be used in the construction of the 3D model. For example, the 3D modeling service may receive one or more CAD files of the facility, one or more building information models (BIMs), one or more floor plans, and/or any other data descriptive of the facility. For example, a BIM may indicate where electrical wiring, heating and cooling air ducts, and various other components of a facility are located (e.g., any components that may or may not be visible by the video cameras.

At block 508, the 3D modeling service may receive indications (if any) of objects/structures/areas to be removed from the constructed 3D model (e.g., for confidentiality, security, etc.). For example, a newly designed car may be removed or visually obscured from the constructed 3D model before the 3D model is provided to a viewing application or other application (e.g., based configuration input from a user that identifies a particular type of car design or other physical aspects of an object as an indicator that the object is a confidential object). As another example, a secret entrance to the facility or a keypad may be removed or visually obscured for security reasons (e.g., based on configuration input from a user that identifies keypads as confidential objects or that identifies the door's location in the facility as a confidential area). In embodiments, the 3D modeling service may identify, based at least on the 3D model, one or more objects at the facility as confidential objects and in response, remove the confidential objects from the 3D model.

At block 510, the 3D modeling service may receive a schedule for updating the 3D model. For example, the schedule may indicate how often an updated 3D model is constructed based on the video streams received at the 3D modeling service and how often results are generated and/or provided to the client. At block 512, the 3D modeling service initiates construction of a 3D model (e.g., the initial 3D model) and updates the 3D model according to the schedule.

In embodiments, the model may be updated on a periodic schedule (e.g., daily, weekly, etc.). In some embodiments, the model may be updated in response to determining that one or more predefined events occur (e.g., an update to a master CAD file is detected, one or more new objects are detected by a video camera, a request for an updated 3D model is received from a user/administrator, etc.).

FIG. 6 is a high-level flowchart illustrating various methods and techniques to implement constructing a 3D model of a facility based on video streams from cameras at the facility, according to some embodiments.

At block 602, the 3D modeling service begins receiving video streams from different video cameras at different fixed locations of a facility. In some embodiments, the 3D modeling service may receive one or more of the video streams from a camera that moves as it is collecting image data (e.g., a rotates back and forth as it streams video).

At block 604, the 3D modeling service determines if there is another video stream from another camera to process. If so, then at block 606, the 3D modeling service obtains image data (e.g., data representing an image) from the video stream that was collected by the camera at a particular time. In embodiments, if the camera is a sweeping camera, then the 3D modeling service may obtain any number of sets of image data that were each collected at approximately a particular time or within a time range (e.g., within a particular time window of 1 minute, 5 minutes, etc.). For example, three images may be obtained within a 10 second window, based on a time-indexed video stream (e.g., timestamps associated with different portions of the stream) that has image data captured at three different points in time within the 10 second window. In an embodiment, an image may be obtained when the camera has rotated the maximum amount in one direction (e.g., left) and another image may be obtained when the camera has rotated the maximum amount in the other direction (e.g., right). In embodiments, any number of different images may be obtained based on a video stream from a given camera, where each image may be captured while the camera is at a different orientation/direction (e.g., providing different fields of view) and/or the captured image is from within a particular time window. In some embodiments, at least some of the video streams may be provided by a camera that is moving (e.g., carried by a person or on a robot moving through the facility).

Returning to block 604, if the 3D modeling service determines there is not another video stream from another camera to process, then at block 608, the 3D modeling service generates a collection of the image data based on the different video streams (e.g., an image is obtained from each video stream a particular point in time). As described herein, in some embodiments, data of one or more sensor streams may also be used to construct the 3D model. At block 610, the 3D modeling service constructs a 3D model of the facility based at least on the collection of image data. In embodiments, any other data may be taking into account by the 3D modeling service (e.g., CAD files, floor plans, measurement data, etc.) to construct the 3D model of the facility. At block 612, the 3D modeling service sends the 3D model to a destination (e.g., for analysis and/or storage).

FIG. 7 is a high-level flowchart illustrating various methods and techniques to identify coverage gaps at a facility and to construct an updated 3D model of the facility based on additional cameras at the facility, according to some embodiments.

As indicated at block 702, a 3D modeling service receives video streams from different cameras at different locations of a facility. At block 704, the 3D modeling service generates a collection of image data based on the video streams (e.g., based on a timestamp in the video stream that indicates the image data was collected at a particular time or approximate time).

At block 706, the 3D modeling service constructs a 3D model based on the collection of image data. At block 708, the 3D modeling service identifies, based on the 3D model, one or more coverage gaps of the cameras. For example, the 3D modeling service may highlight one or more portions of the 3D model to indicate the coverage gaps. In some embodiments, the 3D modeling service may generate measurement data that defines the approximate locations of the coverage gaps. At step 709, the 3D modeling service may infer one or more different structures or objects (e.g., walls or other structures/objects, as discussed herein).

At block 710, the 3D modeling service determines one or more locations at the facility for installation of additional cameras that would reduce or eliminate coverage gaps. At block 712, the 3D modeling service sends data indicating the identified locations to a destination.

At block 714, the 3D modeling service receives additional video streams from cameras at the facility, including one or more video streams from one or more additional cameras that have been installed at the one or more determined locations. At block 716, the 3D modeling service generates an additional collection of image data based on the additional video streams. At block 718, the 3D modeling service constructs an updated 3D model of the facility based on the additional collection of image data.

In some embodiments, a live video stream from one or more cameras may be overlaid onto a 3D model of the facility. For example, one or more live video streams from one or more cameras may be registered with the 3D model to be projected onto a displayed 3D model. This may allow security personnel to monitor the entire facility. This may also provide a convenient way for security to see the entire facility at once, even though at least some of the cameras may be sweeping/panning cameras that provide a view of only certain portions of the facility at a time.

FIG. 8 is a high-level flowchart illustrating various methods and techniques to analyze a 3D model and generate a result based on the analysis, according to some embodiments.

At block 802, a 3D model analyzer receives a 3D model from the 3D modeling service (or local 3D modeling service). At block 804, the 3D model analyzer analyzes the 3D model. At block 806, the 3D model analyzer generates a result based on the analysis. For example, the 3D model analyzer may provide data indicate one or more coverage gaps of the cameras. As another example, the 3D model analyzer may provide data indicating one or more types of detected objects (e.g., highlighting fire extinguishers in the 3D model as part of a safety analysis, types of production equipment, walls, etc.). At block 808, the 3D model analyzer sends the result to a destination. For example, the 3D model analyzer may send the result to a display device so a user may view the result and/or may send the result to one or more data stores.

In some embodiments, the 3D modeling service or the model analyzer may receive data from a sensor at one or more locations of the facility and highlight one or more areas to indicate a condition associated with the sensor (e.g., equipment failure/jam, overheating, etc.). For example, the model analyzer may receive data from a sensor at a location of the facility and determine, based on the received sensor data, a condition/state of equipment associated with the sensor. In response, the model analyzer may add an indication of the condition of the equipment to the 3D model at a location corresponding to the equipment (e.g., graphical highlight/annotation describing the condition/state of the equipment).

In embodiments, some of all of the above blocks may be performed as a batch process (e.g., according to a schedule) and/or as a stream analysis that continually processes input data. For example, in a geo-fencing application, the 3D model may be analyzed along with streaming input that is received on a continual basis from GPS-based, WiFi-based, or other location devices carried by employees of a facility. If analysis of the 3D model and the location of a person (based on the location device) indicates that the person has entered a restricted area and the person is not authorized for the restricted area, then the geo-fencing application may generate an alarm message and send the alarm message to a security guard (e.g., to a display device, as an email, text message, etc.) or to a monitoring application that processes the alarm message to inform security personnel.

The methods described herein may in various embodiments be implemented by any combination of hardware and software. For example, in one embodiment, the methods may be implemented by a computer system (e.g., a computer system as in FIG. 9) that includes one or more processors executing program instructions stored on a computer-readable storage medium coupled to the processors. The program instructions may implement the functionality described herein (e.g., the functionality of the 3D modeling service, 3D modeling service, model analyzer, and other components that implement the techniques described herein). The various methods as illustrated in the figures and described herein represent example embodiments of methods. The order of any method may be changed, and various elements may be added, reordered, combined, omitted, modified, etc.

Figure 9:
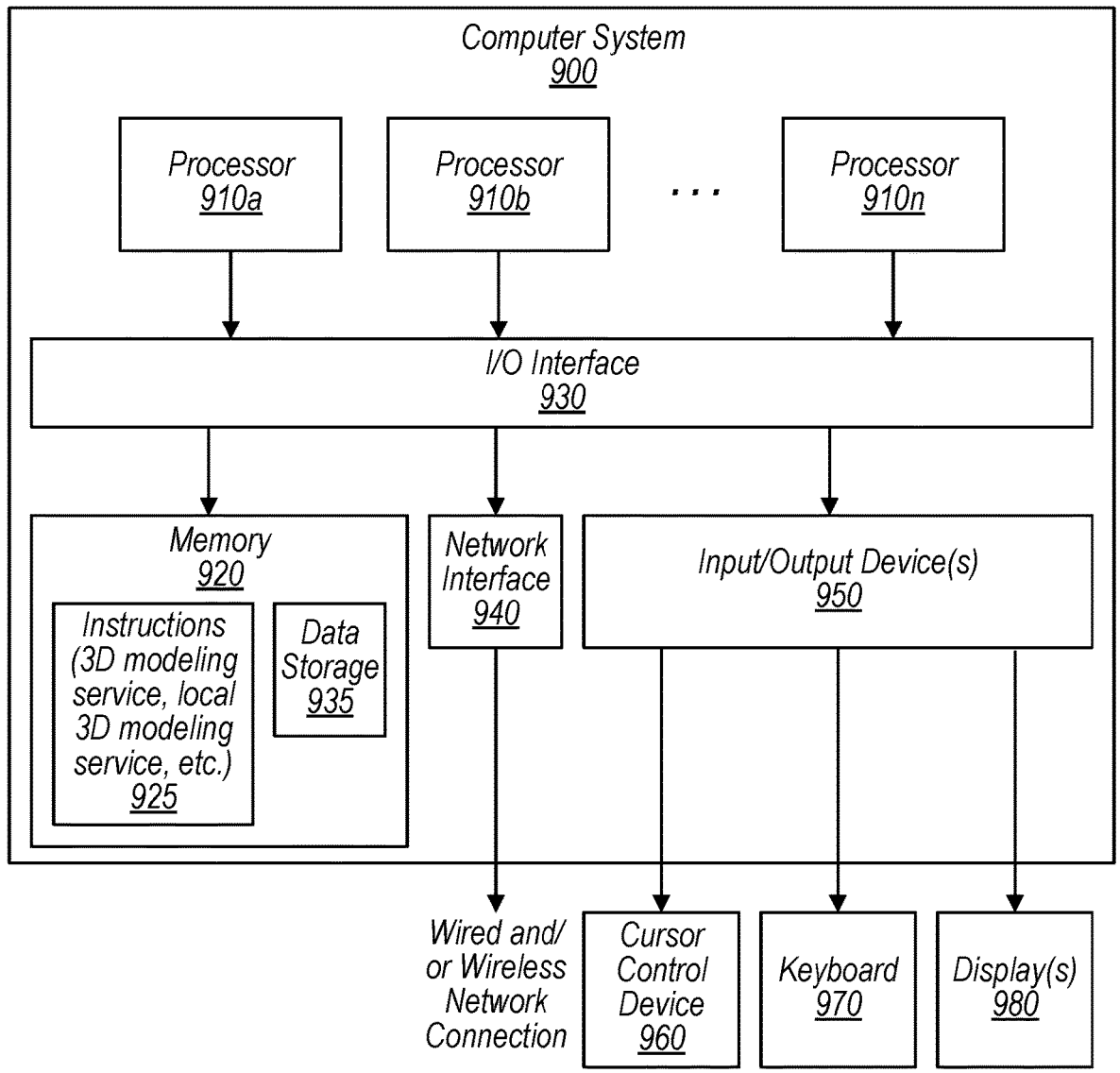
FIG. 9 is a block diagram illustrating an example computing system, according to some embodiments.

Embodiments to implement constructing a 3D model of a facility based on video streams from cameras at the facility as described herein may be executed on one or more computer systems, which may interact with various other systems or devices. One such computer system is illustrated by FIG. 9. In different embodiments, computer system 1100 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing node or compute node, computing device, compute device, or electronic device.

In the illustrated embodiment, computer system 1100 includes one or more processors 1110 coupled to a system memory 1120 via an input/output (I/O) interface 1130. Computer system 1100 further includes a network interface 1140 coupled to I/O interface 1130, and one or more input/output devices 1150, such as cursor control device 1160, keyboard 1170, and display(s) 1180. Display(s) may include standard computer monitor(s) and/or other display systems, technologies or devices, in one embodiment. In some embodiments, it is contemplated that embodiments may be implemented using a single instance of computer system 1100, while in other embodiments multiple such systems, or multiple nodes making up computer system 1100, may host different portions or instances of embodiments. For example, in one embodiment some elements may be implemented via one or more nodes of computer system 1100 that are distinct from those nodes implementing other elements.

In various embodiments, computer system 1100 may be a uniprocessor system including one processor 1110, or a multiprocessor system including several processors 1110 (e.g., two, four, eight, or another suitable number). Processors 1110 may be any suitable processor capable of executing instructions, in one embodiment. For example, in various embodiments, processors 1110 may be general-purpose or embedded processors implementing any of a variety of instruction set architectures (ISAs), such as the x86, PowerPC, SPARC, or MIPS ISAs, or any other suitable ISA. In multiprocessor systems, each of processors 1110 may commonly, but not necessarily, implement the same ISA.

In some embodiments, at least one processor 1110 may be a graphics processing unit. A graphics processing unit or GPU may be considered a dedicated graphics-rendering device for a personal computer, workstation, game console or other computing or electronic device, in one embodiment. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions for execution on one of, or parallel execution on two or more of, such GPUs. The GPU(s) may implement one or more application programmer interfaces (APIs) that permit programmers to invoke the functionality of the GPU(s), in one embodiment.

System memory 1120 may store program instructions 1125 and/or data accessible by processor 1110, in one embodiment. In various embodiments, system memory 1120 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above (e.g., the 3D modeling service, 3D modeling service, model analyzer, other components, etc.) are shown stored within system memory 1120 as program instructions 1125 and data storage 1135, respectively. In other embodiments, program instructions and/or data may be received, sent or stored upon different types of computer-accessible media or on similar media separate from system memory 1120 or computer system 1100. A computer-accessible medium may include non-transitory storage media or memory media such as magnetic or optical media, e.g., disk or CD/DVD-ROM coupled to computer system 1100 via I/O interface 1130. Program instructions and data stored via a computer-accessible medium may be transmitted by transmission media or signals such as electrical, electromagnetic, or digital signals, which may be conveyed via a communication medium such as a network and/or a wireless link, such as may be implemented via network interface 1140, in one embodiment.

In one embodiment, I/O interface 1130 may be coordinate I/O traffic between processor 1110, system memory 1120, and any peripheral devices in the device, including network interface 1140 or other peripheral interfaces, such as input/output devices 1150. In some embodiments, I/O interface 1130 may perform any necessary protocol, timing or other data transformations to convert data signals from one component (e.g., system memory 1120) into a format suitable for use by another component (e.g., processor 1110). In some embodiments, I/O interface 1130 may include support for devices attached through various types of peripheral buses, such as a variant of the Peripheral Component Interconnect (PCI) bus standard or the Universal Serial Bus (USB) standard, for example. In some embodiments, the function of I/O interface 1130 may be split into two or more separate components, such as a north bridge and a south bridge, for example. In addition, in some embodiments some or all of the functionality of I/O interface 1130, such as an interface to system memory 1120, may be incorporated directly into processor 1110.

Network interface 1140 may allow data to be exchanged between computer system 1100 and other devices attached to a network, such as other computer systems, or between nodes of computer system 1100, in one embodiment. In various embodiments, network interface 1140 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1150 may, in some embodiments, include one or more display terminals, keyboards, keypads, touchpads, scanning devices, voice or optical recognition devices, or any other devices suitable for entering or retrieving data by one or more computer system 1100, in one embodiment. Multiple input/output devices 1150 may be present in computer system 1100 or may be distributed on various nodes of computer system 1100, in one embodiment. In some embodiments, similar input/output devices may be separate from computer system 1100 and may interact with one or more nodes of computer system 1100 through a wired or wireless connection, such as over network interface 1140.

As shown in FIG. 11, memory 1120 may include program instructions 1125 that implement the various embodiments of the systems as described herein, and data store 1135, comprising various data accessible by program instructions 1125, in one embodiment. In one embodiment, program instructions 1125 may include software elements of embodiments as described herein and as illustrated in the Figures. Data storage 1135 may include data that may be used in embodiments (e.g., video streams, image data, 3D models, results, other data, etc.). In other embodiments, other or different software elements and data may be included.

Those skilled in the art will appreciate that computer system 1100 is merely illustrative and is not intended to limit the scope of the embodiments as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1100 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-readable medium separate from computer system 1100 may be transmitted to computer system 1100 via transmission media or signals such as electrical, electromagnetic, or digital signals, conveyed via a communication medium such as a network and/or a wireless link. This computer readable storage medium may be non-transitory. Various embodiments may further include receiving, sending or storing instructions and/or data implemented in accordance with the foregoing description upon a computer-accessible medium. Accordingly, the present invention may be practiced with other computer system configurations.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:
one or more processors; and
one or more memories, wherein the one or more memories have stored thereon instructions, which when executed by the one or more processors, cause the one or more processors to implement a 3D modeling service for a plurality of clients of a provider network, wherein the 3D modeling service is configured to, for a given client:
receive, from a remote network of the client, a plurality of video streams from a plurality of cameras, wherein different video streams are from different cameras at respective fixed locations of a facility;
generate a collection of image data based on the plurality of video streams, wherein to generate the collection of image data, the 3D modeling service is configured to:
identify, based on data included in the different video streams that indicates when image data was collected by the different cameras, that different portions of image data of the different video streams were respectively collected by the different cameras of the facility at a same particular time; and
obtain the identified different portions of image data from the different video streams collected by the different cameras of the facility at the same particular time to generate the collection;
obtain other data descriptive of the facility, wherein the other data is from one or more sources other than the cameras;
construct a 3D model of the facility based at least on the different portions of image data of the different video streams that were respectively collected by the different cameras at the same particular time and the other data;
identify, based at least on the 3D model, a coverage gap of the plurality of cameras.
determine, based at least on the 3D model, a location at the facility for installation of an additional camera that would reduce or eliminate the identified coverage gap of the plurality of cameras; and
send, to the remote network or to another destination, the 3D model and data indicative of the location of the additional camera.

2. The system as recited in claim 1, wherein to obtain the other data descriptive of the facility, the 3D modeling service is further configured to:
obtain data indicating one or more physical constraints associated with the facility.

3. The system as recited in claim 1, wherein the 3D modeling service is further configured to:
identify, based at least on the 3D model, one or more other coverage gaps of the plurality of cameras;
determine one or more other locations at the facility for installation of other cameras that would reduce or eliminate individual ones of the other identified coverage gaps; and
send data indicative of the one or more other locations to the remote network or the other destination.

4. The system as recited in claim 3, wherein the 3D modeling service is further configured to perform one or more of:
determine, based on the 3D model, a location to place equipment, or
determine, based on the 3D model, whether a structure that is being built matches design specifications.

5. The system as recited in claim 1, wherein the 3D modeling service is further configured to:
receive, from the remote network of the client, a plurality of additional video streams from the plurality of cameras, wherein different video streams are from different cameras at respective fixed locations of the facility;
generate an additional collection of image data based on the plurality of additional video streams, wherein the additional collection of image data comprises respective image data of different ones of the additional video streams collected by a camera at a subsequent particular time;
construct an updated 3D model of the facility based at least on the 3D model and the additional collection of image data; and
send the updated 3D model to the remote network or to another destination.

6. A method, comprising:
performing, by one or more computing devices:
receiving a plurality of video streams from a plurality of cameras, wherein different video streams are from different cameras at respective locations of a facility;
generating a collection of image data based on the plurality of video streams, wherein the generation of the collection of image data comprises:
identifying, based on data included in the different video streams that indicates when image data was collected by the different cameras, that different portions of image data of the different video streams were respectively collected by the different cameras of the facility at a same particular time; and
obtaining the identified different portions of image data from the different video streams collected by the different cameras of the facility at the same particular time to generate the collection;
obtaining other data descriptive of the facility, wherein the other data is from one or more sources other than the cameras;
constructing a 3D model of the facility based at least on the different portions of image data of the different video streams that were respectively collected by the different cameras at the same particular time and the other data;
identifying, based at least on the 3D model, a coverage gap of the plurality of cameras;
determining, based at least on the 3D model, a location at the facility for installation of an additional camera that would reduce or eliminate the identified coverage gap of the plurality of cameras; and
sending, to a destination, the 3D model and data indicative of the location of the additional camera.

7. The method as recited in claim 6, wherein the other data descriptive of the facility comprises:
one or more physical constraints associated with the facility.

8. The method as recited in claim 7, wherein the one or more physical constraints comprise one or more of:
physical dimensions of a building, or
physical dimensions of a worksite, wherein at least a portion of the worksite is located outside.

9. The method as recited in claim 6, further comprising:
identifying, based at least on the 3D model, one or more coverage gaps of the plurality of cameras;
determining a change in orientation for one or more of the plurality of cameras that will, if implemented, reduce or eliminate individual ones of the identified coverage gaps; and
sending, to the destination or another destination, data indicative of the change in orientation for one or more of the plurality of cameras.

10. The method as recited in claim 6, further comprising:
identify, based at least on the 3D model, one or more other coverage gaps of the plurality of cameras;
determining one or more other locations at the facility for other cameras that would reduce or eliminate individual ones of the other identified coverage gaps; and
sending, to the destination or another destination, data indicative of the one or more other locations.

11. The method as recited in claim 10, further comprising:
receiving, from the remote network of the client, a plurality of additional video streams from the plurality of cameras and one or more of the additional cameras, wherein at least one of the additional cameras is on a mobile drone;
generating an additional collection of image data based on the plurality of additional video streams, wherein a given additional collection of image data comprises respective image data of different ones of the additional video streams collected by a camera at a subsequent particular time;
constructing an updated 3D model of the facility based at least on the 3D model and the additional collection of image data; and
sending the updated 3D model to the destination.

12. The method as recited in claim 6, further comprising:
identifying, based at least on the 3D model, one or more objects at the facility as confidential objects; and
in response to identifying the one or more objects as confidential objects, removing the confidential objects from the 3D model.

13. The method as recited in claim 6, further comprising:
performing, according to a schedule:
generating an additional collection of image data based on a plurality of additional video streams received from the plurality of cameras, wherein the additional collection of image data comprises respective image data of different ones of the additional video streams collected by a camera at a subsequent particular time;
constructing an updated 3D model of the facility based at least on the 3D model and the additional collection of image data; and
sending the updated 3D model to the destination.

14. The method as recited in claim 13, further comprising receiving configuration data comprising one or more of:
the schedule for updating the 3D model, or
identification of the plurality of cameras at the respective fixed locations of the facility.

15. One or more non-transitory computer-accessible storage media storing program instructions that when executed on or across one or more processors cause the one or more processors to:
receive a plurality of video streams from a plurality of cameras, wherein different video streams are from different cameras at respective locations of a facility;
generate a collection of image data based on the plurality of video streams, wherein to generate the collection of image data, the program instructions when executed on or across the one or more processors cause the one or more processors to:
identify, based on data included in the different video streams that indicates when image data was collected by the different cameras, that different portions of image data of the different video streams were respectively collected by the different cameras of the facility at a same particular time: and
obtain the identified different portions of image data from the different video streams collected by the different cameras of the facility at the same particular time to generate the collection;
obtain other data descriptive of the facility, wherein the other data is from one or more sources other than the cameras;
construct a 3D model of the facility based at least on the different portions of image data of the different video streams that were respectively collected by the different cameras at the same particular time and the other data;
identify, based at least on the 3D model, a coverage gap of the plurality of cameras; and
determine, based at least on the 3D model, a location at the facility for installation of an additional camera that would reduce or eliminate the identified coverage gap of the plurality of cameras.

16. The one or more storage media as recited in claim 15, wherein to obtain the other data descriptive of the facility, the program instructions when executed on or across the one or more processors further cause the one or more processors to:
obtain data indicating one or more physical constraints associated with the facility.

17. The one or more storage media as recited in claim 15, wherein to generate a collection of image data based on the plurality of video streams, the program instructions when executed on or across the one or more processors cause the one or more processors to:
select image data of a given video stream based on a timestamp that indicates the image data of the given video stream was collected at the particular time.

18. The one or more storage media as recited in claim 15, further comprising program instructions that when executed on or across the one or more processors further cause the one or more processors to:
receive, from the client, input indicating movement forward or backward in time; and
in response to the input, display one or more previous or subsequent versions of the 3D model.

19. The one or more storage media as recited in claim 15, further comprising program instructions that when executed on or across the one or more processors further cause the one or more processors to:
receive data from a sensor at a location of the facility; and
determine, based on the received sensor data, a condition of equipment associated with the sensor; and
in response to determining the condition of the equipment, add an indication of the condition of the equipment to the 3D model at a location corresponding to the equipment.

20. The one or more storage media as recited in claim 19, wherein to construct the updated 3D model, the program instructions when executed on or across the one or more processors cause the one or more processors to:

determine, based on analysis of at least the 3D model and the updated 3D model, that an object identified in one or more of the 3D model and the updated 3D model is a temporary object; and in response to the determination, remove the object from the updated 3D model.

\* \* \* \* \*